United States Patent
Ahn et al.

(10) Patent No.: US 10,250,165 B2
(45) Date of Patent: Apr. 2, 2019

(54) HIGH SPEED ACTUATOR INCLUDING ACTIVE STIFFNESS CONTROLLER AND METHOD OF DRIVING THE SAME

(71) Applicants: Sung Hoon Ahn, Seongnam (KR); Sung Hyuk Song, Incheon (KR)

(72) Inventors: Sung Hoon Ahn, Seongnam (KR); Sung Hyuk Song, Incheon (KR)

(73) Assignee: SNU R&DB Foundation, Seoul (KR)

( * ) Notice: Subject to any disclaimer, the term of this patent is extended or adjusted under 35 U.S.C. 154(b) by 419 days.

(21) Appl. No.: 15/163,670

(22) Filed: May 25, 2016

(65) Prior Publication Data
US 2016/0352259 A1    Dec. 1, 2016

(30) Foreign Application Priority Data

May 27, 2015 (KR) .................. 10-2015-0074276
Nov. 13, 2015 (KR) .................. 10-2015-0159699

(51) Int. Cl.
| | | |
|---|---|---|
| H01L 41/09 | (2006.01) | |
| H02N 2/06 | (2006.01) | |
| F15B 15/10 | (2006.01) | |
| H01L 41/04 | (2006.01) | |
| H01L 41/047 | (2006.01) | |

(52) U.S. Cl.
CPC .............. *H02N 2/06* (2013.01); *F15B 15/10* (2013.01); *H01L 41/042* (2013.01); *H01L 41/047* (2013.01); *H01L 41/09* (2013.01)

(58) Field of Classification Search
CPC ..... H01L 41/042; H01L 41/047; H01L 41/09; H02N 2/06; F15B 15/10

USPC .......................................... 310/307–371, 800
See application file for complete search history.

(56) References Cited

U.S. PATENT DOCUMENTS 5,485,053 A * 1/1996 Baz .................. F16F 9/306
                                                310/326
5,525,853 A * 6/1996 Nye .................. F16F 15/005
                                                310/316.01

(Continued)

FOREIGN PATENT DOCUMENTS

| DE | 102016200148 A1 * | 7/2013 | .............. G01L 1/14 |
| KR | 1020060016277 A | 2/2006 | |
| KR | 1020130093256 A | 8/2013 | |

OTHER PUBLICATIONS

Office Action dated Nov. 3, 2016 for Korean Patent Application 10-2015-0159899; 5 pgs; The Korean Intellectual Property Office, Republic of Korea.

(Continued)

*Primary Examiner* — Thomas M Dougherty
(74) *Attorney, Agent, or Firm* — Andrew D. Fortney; Central California IP Group, P.C.

(57) ABSTRACT

Disclosed is a high speed actuator. The high speed actuator includes an actuation part configured to cause deformation such as bending or twisting and an active stiffness controller on a surface of the actuation part or in the actuation part configured to control in real time a stiffness (e.g., of the actuator) according to an external signal. The active stiffness controller may control a stiffness of the high speed actuator in order for the actuator to be actuated at a high speed. Moreover, since the stiffness of the actuator is controlled in real time, a speed of the actuator may be controlled in real time.

19 Claims, 15 Drawing Sheets

(56) References Cited

U.S. PATENT DOCUMENTS

| | | | | |
|---|---|---|---|---|
| 5,750,272 | A * | 5/1998 | Jardine | F16F 15/005 |
| | | | | 310/334 |
| 6,188,160 | B1 * | 2/2001 | Main | H01L 41/253 |
| | | | | 310/314 |
| 8,742,647 | B2 * | 6/2014 | Fluhrer | H03K 17/964 |
| | | | | 310/338 |
| 9,168,989 | B2 | 10/2015 | Ahn et al. | |
| 2007/0250036 | A1 * | 10/2007 | Volk | A61M 25/0009 |
| | | | | 604/510 |
| 2008/0073820 | A1 * | 3/2008 | Bendel | F16F 15/005 |
| | | | | 267/140.15 |
| 2013/0210294 | A1 | 8/2013 | Ahn et al. | |
| 2014/0276620 | A1 * | 9/2014 | Millett | A61M 25/0905 |
| | | | | 604/510 |

OTHER PUBLICATIONS

Sung Hoon Ahn et al.; "Underwater Robot Based on Flapping for Enabling the Bending and Twisting Movement Thereof"; Abstract of 10-2013-0093256; Aug. 22, 2013; http://kpa.kipris.or.kr.

Young Ho Seo et al.; "Thin Film Piezoelectric Actuator, Capable of Driving Object Material by Using Elastic Property of Length-Adjustable Elastic Member"; Abstract of 10-2006-0016277; Feb. 22, 2006; http://kpa.kipris.or.kr.

* cited by examiner

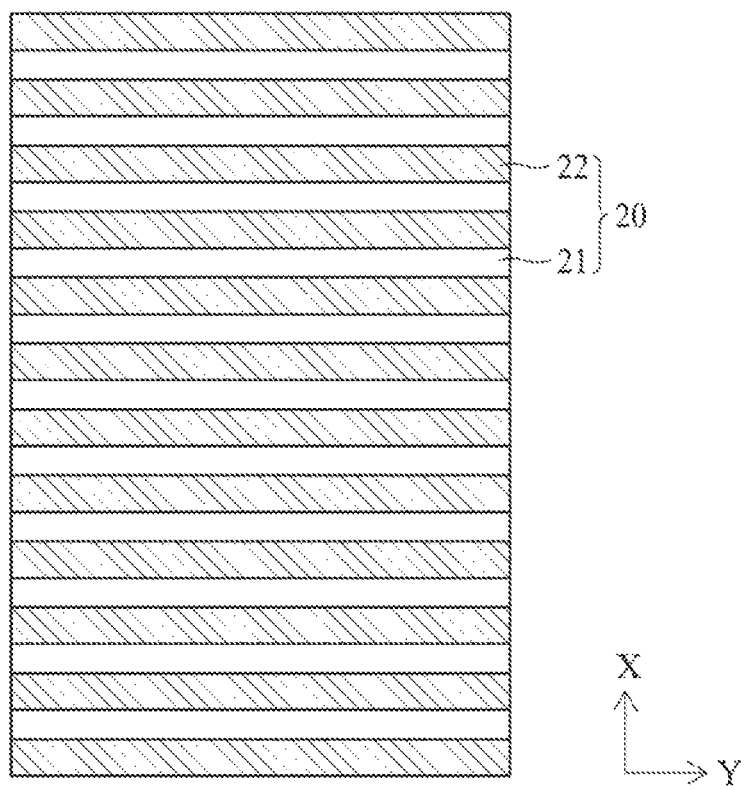

HIGH SPEED ACTUATOR INCLUDING ACTIVE STIFFNESS CONTROLLER AND METHOD OF DRIVING THE SAME

CROSS-REFERENCE TO RELATED APPLICATIONS

This application claims the benefit of Korean Patent Application No. 10-2015-0074276, filed on May 27, 2015, and Korean Patent Application No. 10-2015-0159899, filed on Nov. 13, 2015, each of which is hereby incorporated by reference as if fully set forth herein.

BACKGROUND

Field of the Invention

The present invention relates to an actuator, and more particularly, to a high speed actuator for actively controlling stiffness.

Discussion of the Related Art

Through recent research, smart materials have been applied to various issues for the active or passive control of structures. Examples of such smart materials include shape memory alloys (SMAs), piezoelectric elements, electroactive polymers, etc. The smart materials may be directly attached to a structure or may be inserted into another material to thereby be used in the formed of actuators.

The actuators may implement an operation such as bending or twisting, and the operation such as bending or twisting may be applied to implement a flapping actuator. Therefore, actuators based on smart materials may be applied to various fields such as toys for children, robots, flexible devices, and other home or industrial equipment.

Although a method of implementing a bending or twisting operation using such actuators has been disclosed, a method of controlling a speed of the actuators is not known. For this reason, in the related art, there is a limitation in implementing high speed actuators in terms of structures or materials.

SUMMARY

Accordingly, the present invention is directed to a high speed actuator including an active stiffness controller and a method of driving the same that substantially obviate one or more problems due to limitations and disadvantages of the related art.

An aspect of the present invention is directed to an actuator and a method of driving the same, in which a speed of the actuator is controlled by controlling its stiffness, thereby driving the actuator at a high speed.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a high speed actuator including: an actuation part configured to cause deformation that includes bending or twisting; and an active stiffness controller on a surface of the actuation part or in the actuation part configured to control in real time a stiffness (e.g., of the high speed actuator) according to an external signal.

In another aspect of the present invention, there is provided a high speed actuator including: a first actuation part including a plurality of first smart materials or smart material units and a first base material supporting the plurality of first smart materials or smart material units, the first actuation part being deformable in a first direction; a second actuation part including a plurality of second smart materials or smart material units and a second base material supporting the plurality of second smart materials or smart material units, the second actuation part being deformable in a second direction; and a stiffness controller between the first actuation part and the second actuation part configured to control a stiffness (e.g., of the high speed actuator, wherein the plurality of first smart materials are arranged or oriented in the same direction (e.g., a first common direction), the plurality of second smart materials are arranged or oriented in the same direction (e.g., a second common direction), the first direction in which the first actuation part is deformable differs from the second direction in which the second actuation part is deformable, and the stiffness controller includes a first stiffness controller including a first polymer resin having a first stiffness and a second stiffness controller including a second polymer resin having a second stiffness, the first stiffness controller contacting the second stiffness controller.

In another aspect of the present invention, there is provided a method of driving a high speed actuator, in which the high speed actuator includes an actuation part configured to cause deformation that includes bending or twisting and an active stiffness controller on a surface of the actuation part or in the actuation part configured to control in real time a stiffness (e.g., of the high speed actuator) according to an external signal, the method including: determining an actuation speed of the actuator and determining the stiffness of the actuator based on the determined actuating speed; determining a target stiffness of the active stiffness controller; applying an actuation signal to the actuation part and applying a stiffness control signal to the active stiffness controller; and comparing the target stiffness of the active stiffness controller with an actual stiffness of the active stiffness controller after applying the stiffness control signal; applying a reduction signal to the active stiffness controller when the actual stiffness is greater than the target stiffness; and applying an amplifying signal to the active stiffness controller when the actual stiffness is less than the target stiffness.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings:

FIG. 4 is a schematic plan view of a stiffness controller for a high speed actuator according to yet another embodiment of the present invention;

DETAILED DESCRIPTION OF THE INVENTION

Figure 1:
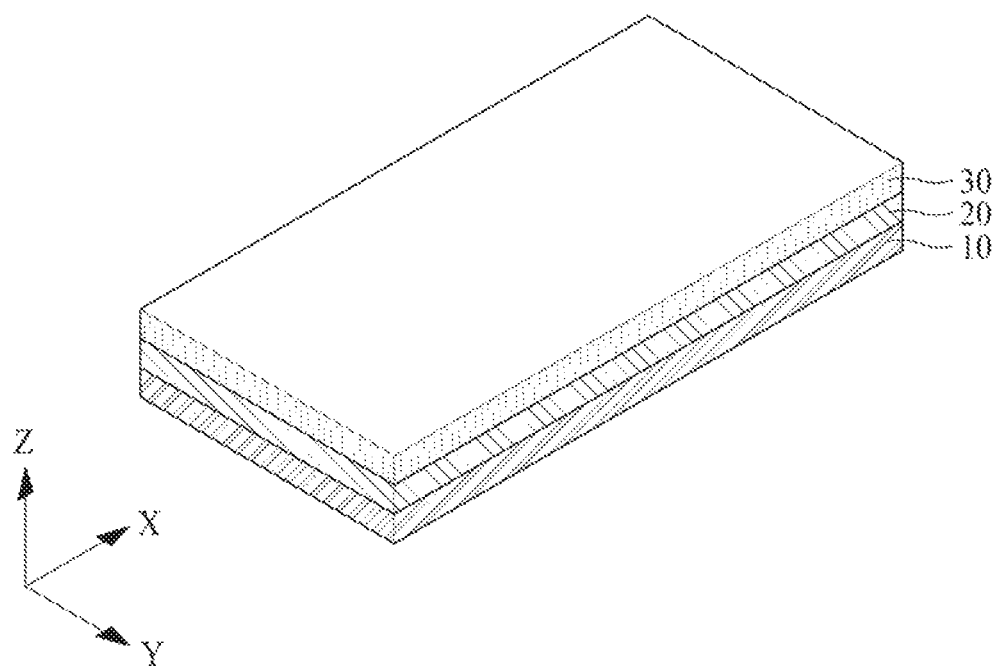
FIG. 1 is a schematic perspective view of a high speed actuator according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts. For example, like reference numerals generally refer to like elements throughout.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is defined by the claims.

A shape, a size, a ratio, an angle, and a number shown or disclosed in the drawings for describing embodiments of the present invention are merely an example, and thus, the present invention is not limited to the illustrated details. In the following description, when the detailed description of the relevant known function(s) or configuration(s) may unnecessarily obscure an important point of the present invention, the detailed description may be omitted. In a case where 'comprise', 'have', and 'include' are used in the present specification, another part may be added unless 'only~' or other similar term is used. The terms of a singular form may include plural forms unless otherwise indicated to the contrary.

In construing an element or term, the element or term may be construed as including an error or margin range, an equivalent, or a recognized or acceptable variation, even though there is no explicit description thereof.

In describing a position relationship, for example, when a positional relation between two parts is described as 'on~', 'over~', 'under~', or 'next to~', one or more other parts may be between the two parts unless 'just' or 'direct' or other similar term is used.

In describing a time relationship, for example, when the temporal order is described as 'after~', 'subsequent~', 'next~', or 'before~', a case which is not continuous and/or in which one or more additional steps or events may be included is encompassed unless 'just' or 'direct' or other similar term is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or completely coupled to or combined with each other, and may be variously inter-operated with each other and actuated technically as those skilled in the art can sufficiently understand. The embodiments of the present invention may be carried out independently from each other, or may be carried out together in co-dependent relationship.

Hereinafter, embodiments of the present invention will be described in detail with reference to the accompanying drawings.

FIG. 1 is a schematic perspective view of a high speed actuator according to an embodiment of the present invention.

As seen in FIG. 1, the high speed actuator according to an embodiment of the present invention may include a first actuation part 10, a stiffness controller 20, and a second actuation part 30.

The first actuation part 10 may include a smart material and a base material that supports the smart material.

The smart material may be fixed in or inserted into the base material. The smart material may be deformed in one direction (for example, a down direction, a direction away from the second actuation part 30, or the −z direction according to the axes shown in FIG. 1) by the first actuation part 10, and deformation such as bending, twisting, and/or the like may occur in the smart material. For example, different parts or regions of the first actuation part 10 or smart material may deform a different distance along the −z axis (e.g., a displacement distance) than other parts or regions of the first actuation part 10 or smart material. The first actuation part 10 may include a plurality of smart materials which are aligned in one direction, and thus may be easily actuated at a high speed. The smart material may comprise or consist of a shape memory alloy (SMA), a piezoelectric element, an ionic polymer metal complex (IPMC), or a conductive polymer (CP), but is not limited thereto. In other embodiments, the smart material may selectively use or include any material the shape of which is deformed by an external signal such as a current signal and/or the like.

The base material may comprise or consist of a soft and/or flexible material that endures deformation. For example, the base material may comprise or consist of a polymer (e.g., a polymer elastic body), silicon, a silicone such as polydimethylsiloxane (PDMS), or the like, but is not limited thereto. The smart material may be a material the shape of which is deformed by an external signal such as a current signal and/or the like, and the first actuation part 10 may be actuated by an operation (e.g., deformation) of the smart material.

The first actuation part 10 may additionally include a directional material in addition to the base material and the smart material. The directional material may be included in or inserted into the base material and/or disposed on a surface of the base material. The directional material may act as an element that suppresses deformation in a specific direction. When the smart material (an active element that induces deformation in the specific direction) is appropriately combined with the directional material (an element that suppresses deformation in the specific direction), various deformations may be realized. The directional material may be obtained through a fiber weaving process, a rapid prototyping process, an injection process, or the like. According to an embodiment of the present invention, the stiffness controller 20 may act as a passive element, and in this case, the first actuation part 10 may not include the directional material.

The stiffness controller 20 may be provided between the first actuation part 10 and the second actuation part 30. The stiffness controller 20 may control a stiffness of the actuator, thereby enabling the actuator to operate at a high speed or at any of a plurality of speeds. The stiffness controller 20 may include at least two stiffness control materials having different stiffnesses. That is, the stiffness controller 20 having a desired stiffness range may be obtained by appropriately selecting and combining a plurality of stiffness control materials having different stiffnesses. Examples of a stiffness control material for the stiffness controller 20 may include a polymer resin. Depending on the kind or type of polymer, different polymer resins have different stiffnesses, and by using polymer resins, the stiffness controller 20 may have any of a wide variety of shapes.

Likewise with the first actuation part 10, the second actuation part 30 may include a smart material and a base material that supports the base material. The smart material may be fixed in or inserted into the base material. The smart material may be deformed in another direction (for example, an up direction, a direction opposite from the deformation direction of the first actuation part 10, a direction away from the first actuation part 10, or the z direction according to the axes shown in FIG. 1) by the second actuation part 30, and deformation such as bending, twisting, and/or the like may occur in the smart material of the second actuation part 30 similarly or identically to the smart material of the first actuation part 10. The second actuation part 20 may include a plurality of the smart materials which are aligned in one direction, and thus may be easily actuated at a high speed. A detailed configuration of each of the base material and the smart material in the second actuation part 30 may be the same as that of the first actuation part 10, and thus, its detailed description is not repeated. Also, similarly or identically to the first actuation part 10, the second actuation part 30 may additionally include a directional material in addition to the base material and the smart material.

In various embodiments to be described below, like reference numerals refer to like elements, and descriptions of the same elements and like materials are not repeated.

Figure 2A:
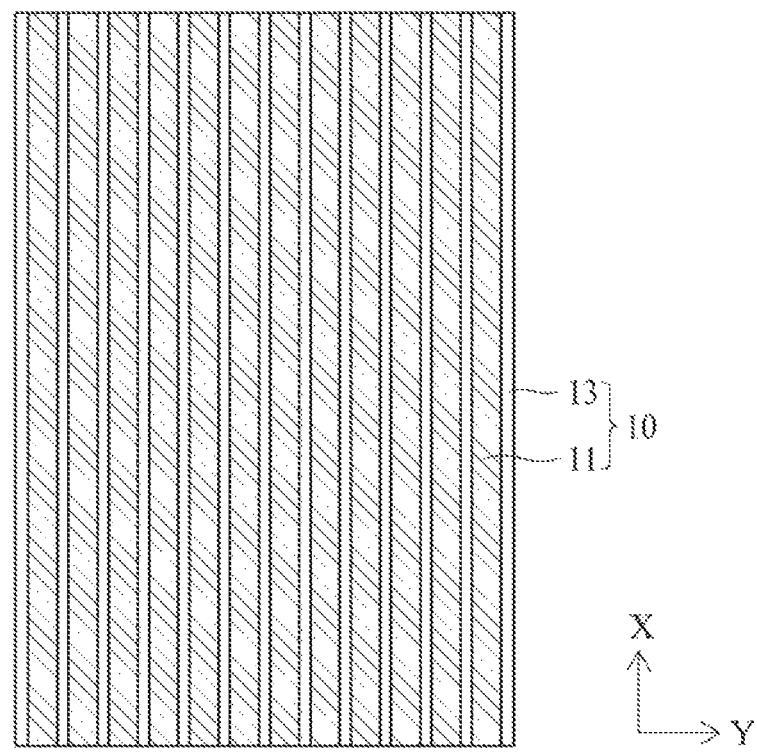
FIG. 2A is a schematic plan view of a first actuation part for a high speed actuator according to an embodiment of the present invention.
Figure 2B:
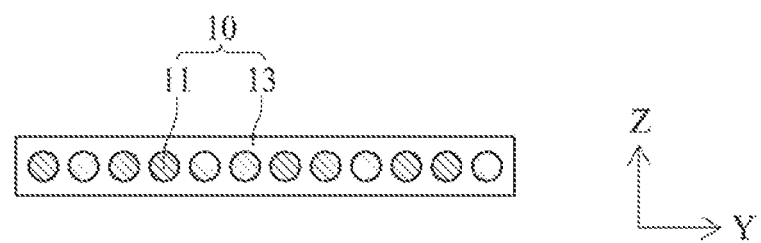
FIG. 2B is a cross-sectional view of the first actuation part of FIG. 2A.

FIG. 2A is a schematic plan view of a first actuation part 10 for a high speed actuator such as the high speed actuator of FIG. 1 according to an embodiment of the present invention, and FIG. 2B is a cross-sectional view of the first actuation part 10.

As seen in FIGS. 2A and 2B, the first actuation part 10 according to an embodiment of the present invention may include a plurality of smart materials (e.g., smart material units) 11 and a base material 13.

The smart materials or smart material units 11 may be aligned in one direction (e.g., with the longest dimension along the x-axis), and particularly, the smart materials or smart material units 11 may be aligned or spaced at certain intervals in the same or a different direction (e.g., adjacent smart material sections or units 11 are spaced by a predetermined distance along the y-axis). For example, the smart material units 11 may have a rod-like or cylindrical shape with a length equal to or substantially equal to the length of the first actuation part 10 and a circular or substantially circular cross-section, but the invention is not limited thereto. In this manner, since the smart materials or smart material units 11 are aligned in the same direction, the actuator according to an embodiment of the present invention may operate at a high speed. An actuating speed of the actuator may be controlled to within a predetermined or desired range by appropriately adjusting the number of the smart materials 11 and the spacing or distance between the smart materials or smart material units 11.

The base material 13 may support the smart materials or pattern of smart material units 11, and particularly, the smart materials or smart material units 11 may be placed or inserted into or surrounded by the base material 13.

Although not shown, the smart materials 11 may include a plurality of first smart materials or smart material units aligned in a first direction, and a plurality of second smart materials or smart material units aligned in a second direction. In this case, the plurality of first smart materials or smart material units and the plurality of second smart materials or smart material units may form or be in different layers so as not to cause interference (e.g., so as not to interfere with each other). In this manner, when the first actuation part 10 includes the plurality of first smart materials or smart material units and the plurality of second smart materials or smart material units which are aligned in different directions, various deformations of the first actuation part 10 may be realized. For example, selected ones of the first smart materials or smart material units and/or the second smart materials or smart material units may be actuated and the others may not be actuated, or all of the first smart materials or smart material units and/or the second smart materials or smart material units may be actuated. In these cases, the first actuation part 10 may be deformed in a variety of different ways, directions and/or displacement distances.

Although not shown in FIGS. 2A and 2B, the above-described second actuation part 30 may also be formed and/or shown as for the first actuation part 10 in FIGS. 2A and 2B, and the description of the first actuation part 10 may also apply to the second actuation part 30. The first actuation part 10 and the second actuation part 30 may have the same shape or may have different shapes.

Figure 3A:
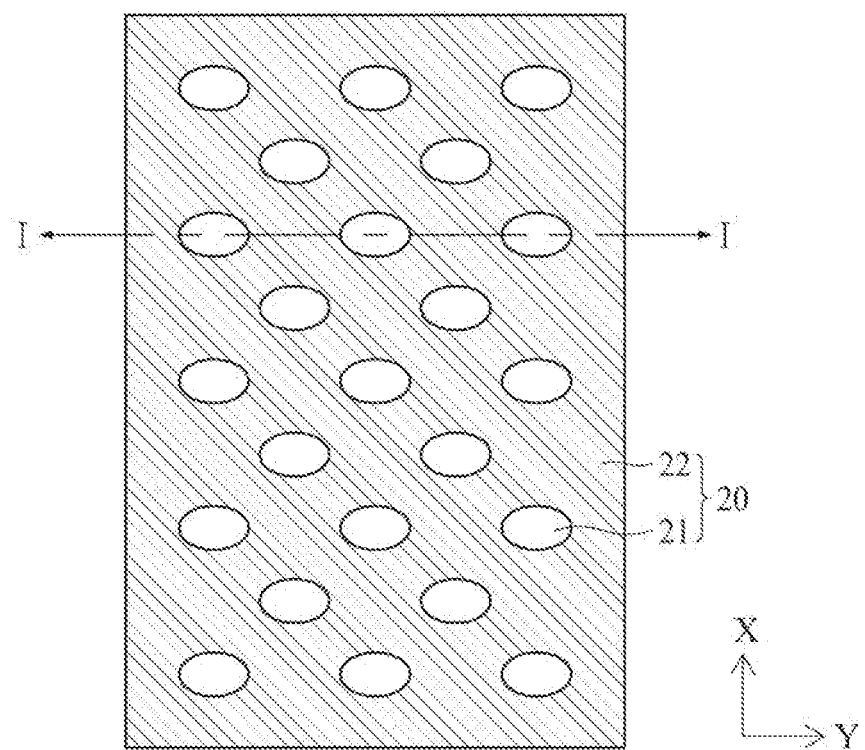
FIG. 3A is a schematic plan view of a stiffness controller for a high speed actuator according to an embodiment of the present invention.
Figure 3B:
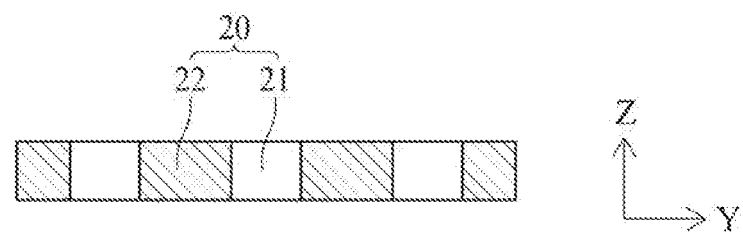
FIG. 3B is a cross-sectional view of the stiffness controller taken along line I-I of FIG. 3A.

FIG. 3A is a schematic plan view of a stiffness controller 20 for a high speed actuator according to an embodiment of the present invention, and FIG. 3B is a schematic cross-sectional view of the stiffness controller 20.

As seen in FIGS. 3A and 3B, the stiffness controller 20 according to an embodiment of the present invention may include a first stiffness controller 21 and a second stiffness controller 22.

The first stiffness controller 21 may comprise or be formed of a polymer resin having a first stiffness, and the second stiffness controller 22 may comprise or be formed of a polymer resin having a second stiffness different from the first stiffness. In this manner, the stiffness of the stiffness controller 20 as a whole may be controlled using the first stiffness controller 21 having the first stiffness and the second stiffness controller 22 having the second stiffness. Although not shown, the stiffness controller 20 may additionally include a third stiffness controller having a third stiffness that differs from the first stiffness and the second stiffness, in addition to the first stiffness controller 21 and the second stiffness controller 22.

The first stiffness controller 21 may contact the second stiffness controller 22, and particularly, the first stiffness controller 21 may have an elliptical or oval shape, and the second stiffness controller 22 may surround and/or be in the areas between adjacent first stiffness controllers 21 (e.g., as a matrix). However, the present embodiment is not limited thereto. In other embodiments, the first stiffness controller 21 may have a curved shape such as a circular shape or the like in addition to an elliptical shape, or may have a polygonal shape such as a triangular shape, a tetragonal shape, a pentagonal shape, an irregular shape, or the like. The first stiffness controller 21 may have a certain pattern or may have a random pattern instead of the certain pattern. The first stiffness controller 21 may have or include a plurality of island structures (e.g., isolated or discrete structures), and by appropriately adjusting the area of an individual island structure and the density of the plurality of structures, the first stiffness controller 21 may have or apply a wholly uniform resistance force against other forces which are applied in various directions (e.g., by the first and second actuation parts 10 and 30).

FIG. 4 is a schematic plan view of a stiffness controller 20 for a high speed actuator according to another embodiment of the present invention.

As seen in FIG. 4, the stiffness controller 20 according to another embodiment of the present invention may include a first stiffness controller 21 and a second stiffness controller 22. The first and second stiffness controllers 21 and 22 may comprise or consist of alternating units or strips.

The first stiffness controller 21 and the second stiffness controller 22 may alternate in the same direction (for example, a horizontal direction), and adjacent first and second stiffness controller strips may be in contact with each other. Furthermore, adjacent first stiffness controller strips or units may be spaced apart or separated by (or be spaced apart or separated only by) a second stiffness controller strip or unit. Although not shown, the first stiffness controller 21 and the second stiffness controller 22 may alternate in a vertical direction. A width of each of the first stiffness controller 21 (or the strips or units thereof) and the second stiffness controller 22 (or the strips or units thereof) may vary or be constant.

Although not shown, the stiffness controller 20 may additionally include a third stiffness controller that intersects or that runs parallel with the first stiffness controller 21 and the second stiffness controller 22.

When the stiffness controller 20 illustrated in FIG. 4 is used in the present high speed actuator, even though the first actuation part 10 or the second actuation part 30 causes the high speed actuator to bend in a horizontal and/or vertical direction, the bending function or operation may not change to or include a twisting function or operation by the first stiffness controller 21 and the second stiffness controller 22. Since a resistance force of the stiffness controller 20 in the horizontal direction differs from that of the stiffness controller 20 in the vertical direction, the degree to which the first actuation part 10 or the second actuation part 30 bends may differ.

Figure 5:
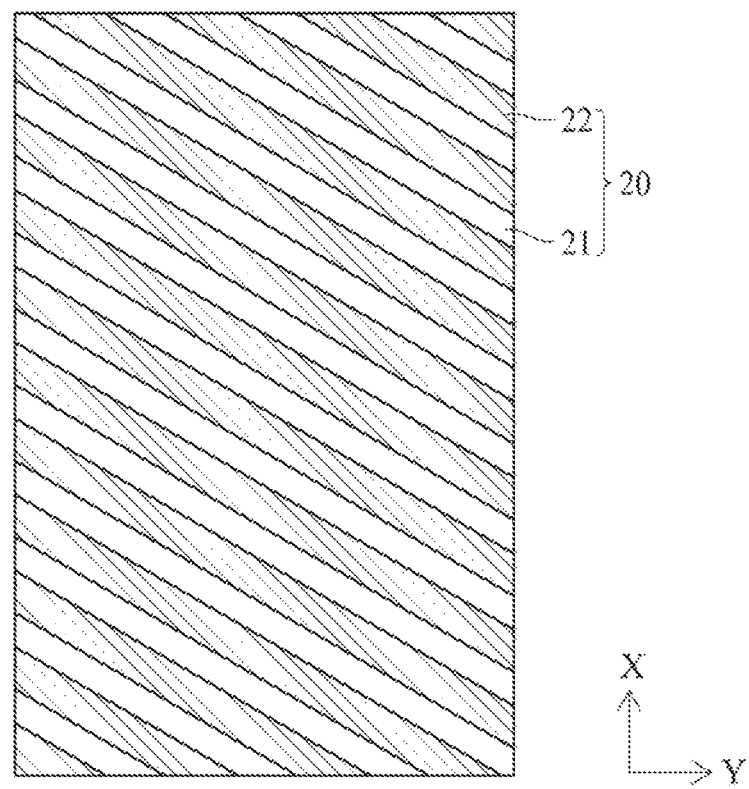
FIG. 5 is a schematic plan view of a stiffness controller for a high speed actuator according to a still further embodiment of the present invention.

FIG. 5 is a schematic plan view of a stiffness controller 20 for a high speed actuator according to yet another embodiment of the present invention.

As seen in FIG. 5, the stiffness controller 20 according to yet another embodiment of the present invention may include a first stiffness controller 21 and a second stiffness controller 22 which are alternately arranged in the same direction.

The first stiffness controller 21 and the second stiffness controller 22 may alternate in a diagonal direction (e.g., relative to the peripheral borders of the stiffness controller 20). Therefore, when the first actuation part 10 and the second actuation part 30 are actuated, an operation and/or deformation direction of each of the first actuation part 10 and the second actuation part 30 may be changed by the stiffness controller 20. In detail, when the first actuation part 10 or the second actuation part 30 bends in a horizontal or vertical direction, the bending function or operation may change to or include a twisting function or operation by the first stiffness controller 21 and the second stiffness controller 22, units or strips of which alternate in a diagonal direction.

Figure 6:
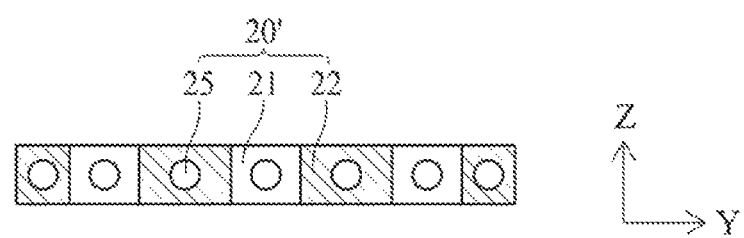
FIG. 6 is a cross-sectional view of a stiffness controller according to a still further embodiment of the present invention.

FIG. 6 is a cross-sectional view of a stiffness controller 20' according to a still further embodiment of the present invention.

As seen in FIG. 6, the stiffness controller 20' according to another still further embodiment of the present invention may include a stiffness change apparatus 25 in addition to the alternating first and second stiffness controllers 21 and 22.

After the stiffness controller 20 according to the above-described embodiments is manufactured, the stiffness of the stiffness controller 20 cannot be changed. However, in the stiffness controller 20' illustrated in FIG. 6, the stiffness may be changed or modified by the stiffness change apparatus 25.

The stiffness change apparatus 25 may be inserted into or enclosed or surrounded by at least one of the first stiffness controller 21 and the second stiffness controller 22, but is not limited thereto. In other embodiments, the stiffness change apparatus 25 may be on a surface of at least one of the first stiffness controller 21 and the second stiffness controller 22.

The stiffness change apparatus 25 may comprise or be formed of a smart material. In this case, the smart material may be selected from among those described for the first and second actuation parts 10 and 30, and may be deformed by an external signal such as a current signal and/or the like. Thus, a stiffness of the stiffness controller 20 may be changed. In this case, particularly, the stiffness of the stiffness controller 20 may be controlled in real time.

The stiffness change apparatus 25 may comprise or be configured by a combination of a melting or softening material, such as metal that melts or softens at a low temperature, and a heating mechanism such as a heating wire that heats the melting or softening material. In this case, the melting or softening material may be melted or softened by the heating mechanism, thereby further lowering the stiffness of the stiffness controller 20 (e.g., at room temperature).

Figure 7A:
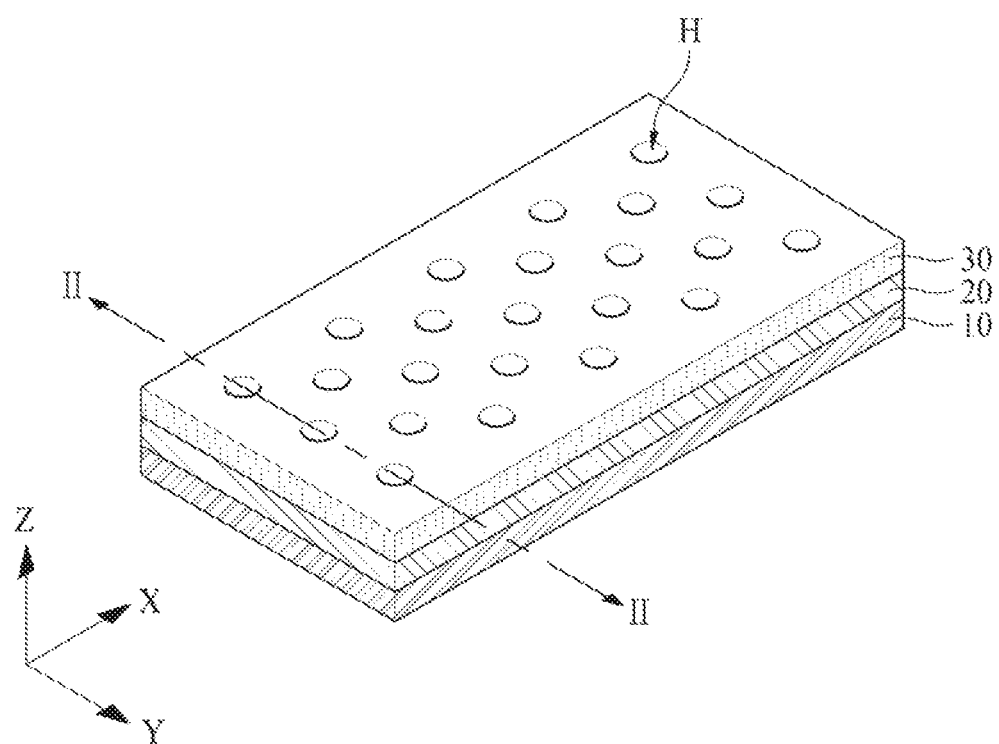
FIG. 7A is a schematic perspective view of a high speed actuator according to another embodiment of the present invention.
Figure 7B:
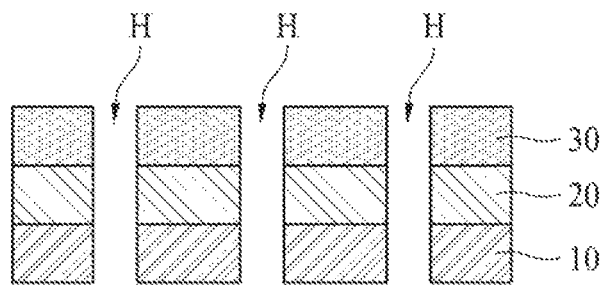
FIG. 7B is a cross-sectional view of the high speed actuator taken along line II-II of FIG. 7A.

FIG. 7A is a schematic perspective view of a high speed actuator according to another embodiment of the present invention, and FIG. 7B is a cross-sectional view of the high speed actuator according to the embodiment of FIG. 7A.

As seen in FIGS. 7A and 7B, the high speed actuator according to this embodiment of the present invention may include a first actuation part 10, a stiffness controller 20, and a second actuation part 30.

One or more air holes H may be formed in each of the first actuation part 10, the stiffness controller 20, and the second actuation part 30. Therefore, external air may pass through the high speed actuator via the air holes H, and thus, the time period during which the high speed actuator cools down may be reduced or shortened. The drawings show an example where the air holes H in the first actuation part 10, the stiffness controller 20, and the second actuation part 30 overlap each other, but the present embodiment is not limited thereto. In other embodiments, the air hole(s) H may be formed in at least one of the first actuation part 10, the stiffness controller 20, and the second actuation part 30.

The air hole(s) H in the first actuation part 10 may be in the base material 13 for the first actuation part 10, and in this case, the base material 13 may comprise or be formed of a porous polymer resin. The air hole(s) H in the second actuation part 30 may be in a base material 13 for the second actuation part 30, and in this case, the base material 13 may also comprise or be formed of a porous polymer resin. The air hole(s) H in the stiffness controller 20 may be in at least one of the above-described first to third stiffness controllers 21 to 23, and in this case, the first to third stiffness controllers 21 to 23 may each comprise or be formed of a porous polymer resin.

Except where the air hole H is formed after formation of the first actuation part 10, the stiffness controller 20, or the second actuation part 30, a detailed configuration of each of the first actuation part 10, the stiffness controller 20, and the second actuation part 30 may vary or be modified as described above.

Figure 8A:
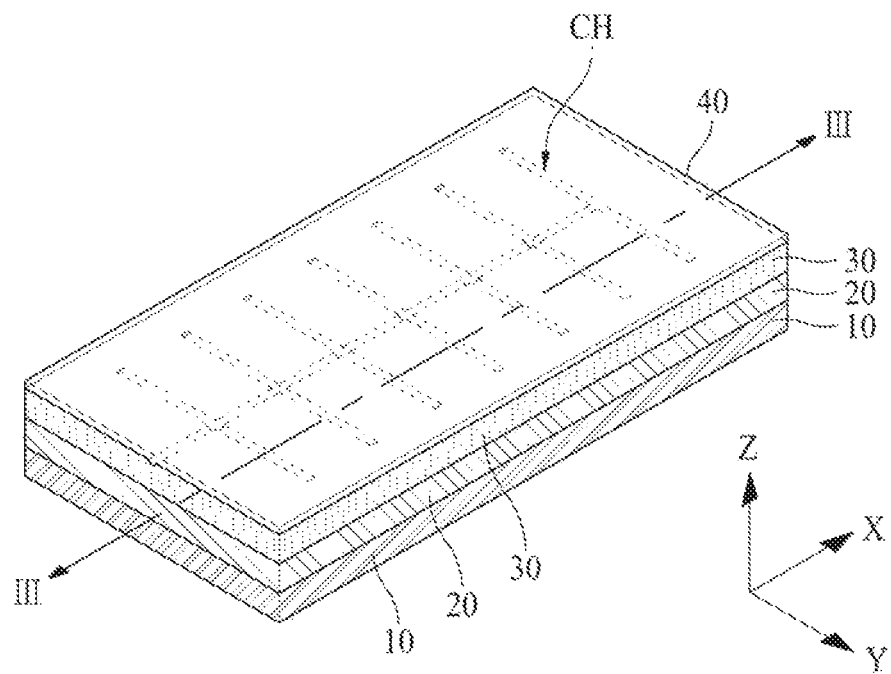
FIG. 8A is a schematic perspective view of a high speed actuator according to yet another embodiment of the present invention.
Figure 8B:
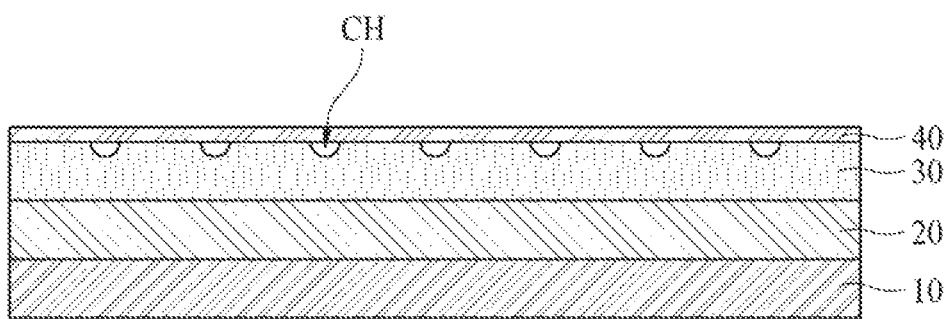
FIG. 8B is a cross-sectional view of the high speed actuator taken along line of FIG. 8A.

FIG. 8A is a schematic perspective view of a high speed actuator according to yet another embodiment of the present invention, and FIG. 8B is a cross-sectional view of the high speed actuator according to FIG. 8A.

As seen in FIGS. 8A and 8B, the high speed actuator according to yet another embodiment of the present invention may include a first actuation part 10, a stiffness controller 20, a second actuation part 30, and a humidification layer 40.

A channel CH through which a fluid such as water or the like is capable of flowing may be formed on an outer surface of the second actuation part 30, particularly, a surface of the second actuation part 30 contacting the humidification layer 40. Also, the humidification layer 40 may be formed on or affixed or secured to the second actuation part 30 over or in contact with the channel CH. The channel CH may be provided in the base material 13 for the second actuation part 30.

According to the embodiment of the present invention shown in FIGS. 8A and 8B, a fluid such as water or the like may flow through the channel CH, and the flowing fluid may evaporate to the outside through the humidification layer 40. Therefore, the time period during which the high speed actuator cools down may be reduced or shortened. The humidification layer 40 may absorb the fluid and then may externally evaporate the absorbed fluid, and thus may comprise or be formed of a material capable of moisture absorption and evaporation.

FIGS. 8A and 8B illustrate an example where the channel CH through which fluid is capable of flowing is formed in a surface of the second actuation part 30 (particularly, a top surface or a surface facing the humidification layer 40), and the humidification layer 40 is on the second actuation part 30, but the present invention is not limited thereto. In other embodiments, the channel CH through which fluid is capable of flowing may be formed in a surface of the first actuation part 10 (particularly, a bottom surface or a surface facing away from the second actuation part 30), and the humidification layer 40 may be formed on the surface of the first actuation part 10 facing away from the second actuation part 30. When the channel CH through which fluid is capable of flowing is formed in the surface of the first actuation part 10, the channel CH may be in the base material 13 for the first actuation part 10.

Figure 9:
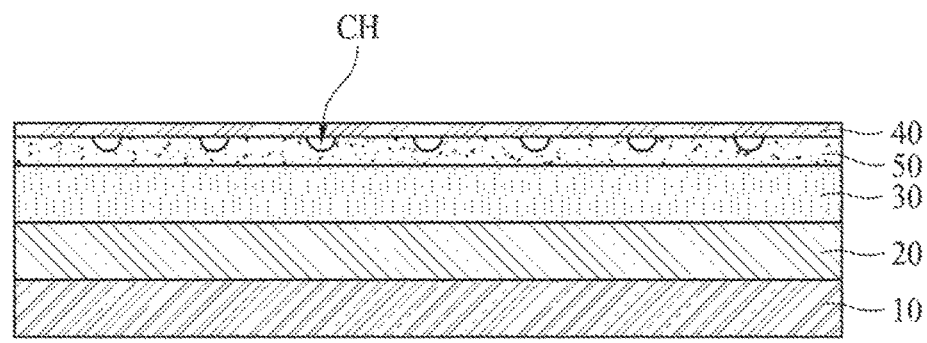
FIG. 9 is a cross-sectional view of a high speed actuator according to another embodiment of the present invention.

FIG. 9 is a cross-sectional view of a high speed actuator according to a still further embodiment of the present invention.

As seen in FIG. 9, the high speed actuator according to the still further embodiment of the present invention may include a first actuation part 10, a stiffness controller 20, a second actuation part 30, a humidification layer 40, and a channel forming layer 50.

In FIGS. 8A and 8B, the channel CH is on the surface of the second actuation part 30. In FIG. 9, however, the channel CH may be in a surface of the channel forming layer 50, rather than in the surface of the second actuation part 30. The channel forming layer 50 may be between the second actuation part 30 and the humidification layer 40, and the channel CH may be in the surface of the channel forming layer 50 that contacts the humidification layer 40.

The drawing illustrates an example where the channel forming layer 50 and the humidification layer 40 are on the second actuation part 30 in sequence, but the present embodiment is not limited thereto. In other embodiments, the channel forming layer 50 and the humidification layer 40 may be in sequence on the surface of the first actuation part 10 facing away from the second actuation part 30.

Figure 10:
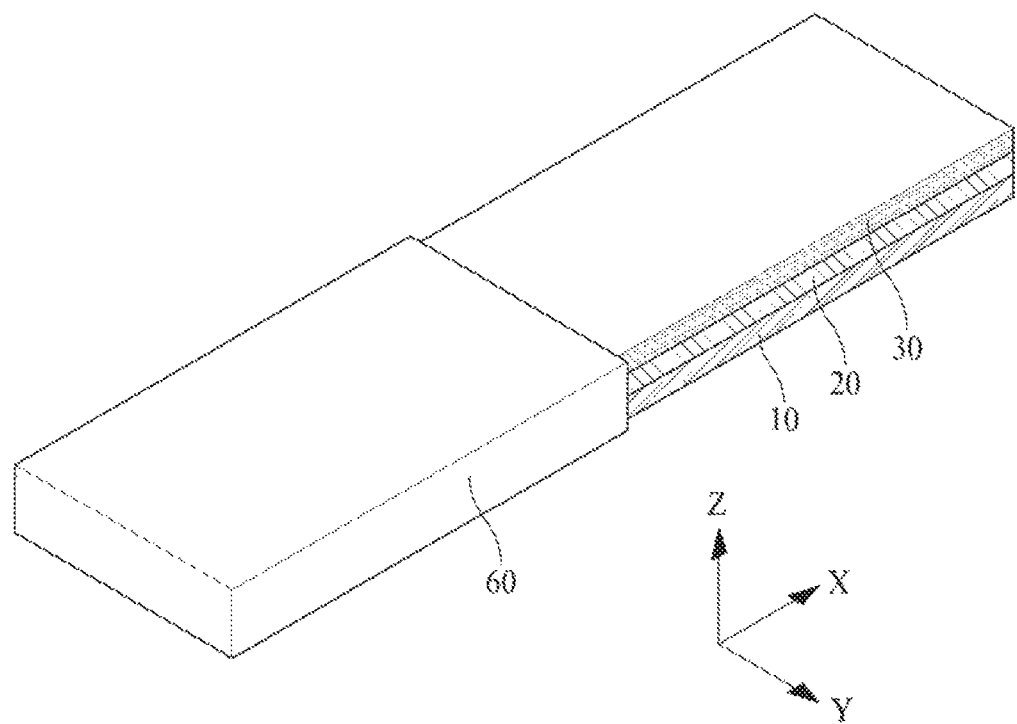
FIG. 10 is a schematic perspective view of a high speed actuator according to another embodiment of the present invention.

FIG. 10 is a schematic perspective view of a high speed actuator according to an even further embodiment of the present invention.

As seen in FIG. 10, the high speed actuator according to the even further embodiment of the present invention may include a first actuation part 10, a stiffness controller 20, a second actuation part 30, and a passive part 60.

The passive part 60 may be a passive element, and the passive part 60 itself is not deformed or deformable. The passive part 60 may be on or attached to one side (e.g., an outer peripheral side or surface) of each of the first actuation part 10, the stiffness controller 20, and the second actuation part 30, and thus, the total deformation amount (e.g., distance or volume) of the high speed actuator increases. That is, when deformation of the high speed actuator is caused by a combination of the first actuation part 10, the stiffness controller 20, and the second actuation part 30, the passive part 60 may move together with first actuation part 10, the stiffness controller 20, and the second actuation part 30, and thus, the total deformation amount of the high speed actuator increases through deformation of only a portion of the high speed actuator.

A shape of the passive part 60 as well as a width of the passive part 60 may be vary or differ from that shown in FIG. 10. Also, the passive part 60 may be on or attached to part of an adjacent surface of the first actuation part 10, the second actuation part 30, and optionally, the stiffness controller 20 to increase the mechanical strength of the connection between the passive part 60 and the remainder of the high speed actuator.

Figure 11:
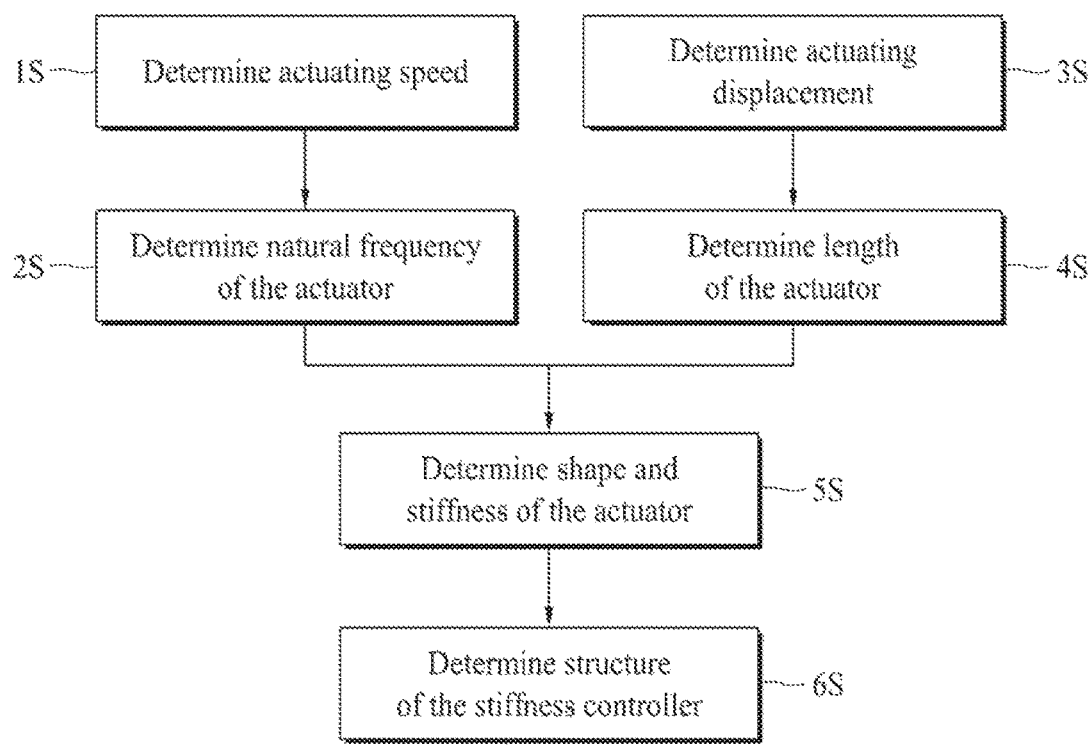
FIG. 11 is a flowchart illustrating a method of designing a high speed actuator according to an embodiment of the present invention.

FIG. 11 is a flowchart illustrating a method of designing a high speed actuator according to an embodiment of the present invention. Hereinafter, the method will be described with reference to FIG. 11 and to FIGS. 1 to 10, which illustrate various structures of a high speed actuator according to the above-described embodiments.

First, the method may determine an actuating speed in operation 1S, and may determine a natural frequency of the actuator based on the determined actuating speed in operation 2S.

The actuating speed may be determined in consideration of the application field and usability of the high speed actuator, and the natural frequency of the actuator may be determined based on the determined actuating speed. Each of the actuating speed and the natural frequency may be determined as a value within a specific range having a lower limit and an upper limit.

Subsequently, the method may determine an actuating displacement in operation 3S, and may determine a length of the actuator based on the determined actuating displacement in operation 4S.

The actuating displacement may be determined in consideration of the application field and usability of the high speed actuator, and operation 4S of determining the length of the actuator may include determining whether the length of the actuator matches the actuating displacement (e.g., as in FIGS. 1 to 9) or whether the length of the actuator is greater than the actuating displacement (e.g., by adding the passive part 60 as in FIG. 10). In one embodiment, the method may further comprise adjusting the length of the actuator to match or exceed the actuating displacement.

Subsequently, in operation 5S, the method may determine a shape and stiffness of the actuator, based on the determined natural frequency and length of the actuator.

Operation 5S of determining the shape of the actuator may include determining whether the actuator includes the first actuation part 10, the stiffness controller 20, and the second actuation part 30 as in FIGS. 1 to 7 or whether the actuator additionally includes the humidification layer 40 as in FIGS. 8 and 9. Also, in determining a shape of each of the first actuation part 10, the stiffness controller 20, and the second actuation part 30, the method may determine whether one or more air holes H are to be formed in each of the first actuation part 10, the stiffness controller 20, and the second actuation part 30 as in FIGS. 7A and 7B.

Operation 5S of determining the shape of the actuator may also include determining the number of smart materials (or the number and/or size of smart material strips or units) to be included in the first actuation part 10 and the second actuation part 30. The number of smart materials or strips or units thereof may be associated with a deformation size of the actuator. That is, as the number of smart materials or strips or units thereof increases, an actuating force of the actuator may increase, thereby realizing a relatively large deformation.

The stiffness of the actuator may be determined or specified as a stiffness range that satisfies both a natural frequency range and the length of the actuator. As the natural frequency and length of the actuator increases, the stiffness range of the actuator may increase.

The stiffness of the actuator may be determined by a combination of the stiffness(es) of the first and/or second actuation part(s) 10 and/or 30 and a stiffness of the stiffness controller 20. Particularly, the stiffnesses of the first and second actuation parts 10 and 30 are difficult to control, but the stiffness of the stiffness controller 20 may be controlled as described above. Therefore, operation 5S of determining the shape of the actuator may include determining a stiffness range of the stiffness controller 20, based on the stiffness(es) of the first and/or second actuation part(s) 10 and/or 30.

Subsequently, in operation 6S, the method may determine a structure of the stiffness controller, based on the determined stiffness of the actuator and optionally the stiffness(es) of the first actuation part 10 and/or second actuation part 30.

Operation 6S of determining the structure of the stiffness controller may include determining a material and a shape of each of the first and second stiffness controllers 21 and 22.

Moreover, operation 6S of determining the structure of the stiffness controller may include determining whether the stiffness of the stiffness controller 20 is a fixed type (e.g., as in the stiffness controllers of FIGS. 3 to 5) or whether the stiffness of the stiffness controller 20 is a variable type (e.g., in which the stiffness controller includes the stiffness change apparatus 25 as in FIG. 6).

Figure 12:
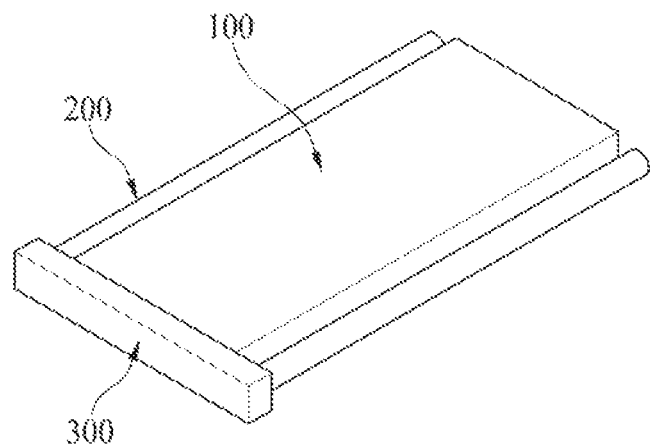
FIG. 12 is a schematic perspective view of a high speed actuator according to another embodiment of the present invention.

FIG. 12 is a schematic perspective view of a high speed actuator according to another embodiment of the present invention.

As seen in FIG. 12, the high speed actuator may include an actuation part 100, an active stiffness controller 200, and a fixing part 300.

The actuation part 100 may cause a deformation, such as bending or twisting, of the high speed actuator as disclosed herein.

The actuation part 100 may include a smart material. The smart material may comprise or consist of a shape memory alloy (SMA), a piezoelectric element, an ionic polymer metal complex (IPMC), or a conductive polymer (CP), but is not limited thereto. In other embodiments, the smart material may selectively use or include any material the shape of which is deformed by an external signal such as a current signal and/or the like. A detailed example of the actuation part 100 will be described below.

The active stiffness controller 200 may actively control a stiffness of the high speed actuator, thereby enabling the actuator to be actuated at a high speed. Particularly, a stiffness of the active stiffness controller 200 may be controlled by an external signal, and thus, an actuating speed of the actuator is easily controlled.

The active stiffness controller 200 as illustrated may be coupled to a surface (for example, a left surface, a right surface, a surface defining or defined by a thickness and optionally a length of the actuation part 100, a combination thereof, etc.) of the actuation part 100, but is not limited thereto. In detail, the active stiffness controller 200 may be on a surface of at least one of a top, a bottom, a right surface, a left surface, a front surface, and a rear surface of the actuation part 100. Also, the active stiffness controller 200 may be in the actuation part 100.

The active stiffness controller 200 may include a smart material such as an SMA or the like, an electromagnet module, or a soft tube or cylinder that internally includes a fluid. This will be described below.

The fixing part 300 may be coupled to one end or surface of the active stiffness controller 200 and may fix the active stiffness controller 200 or the end or surface thereof. As illustrated, when a plurality of active stiffness controllers 200 are present, the fixing part 300 may be coupled to an end or surface of each of the plurality of active stiffness controllers 200.

The fixing part 300 may be omitted. Particularly, as described above, when the active stiffness controller 200 is in the actuation part 100, the necessity of fixing the active stiffness controller 200 or an end or surface thereof may be low, and thus, the fixing part 300 may be omitted.

Figure 13:
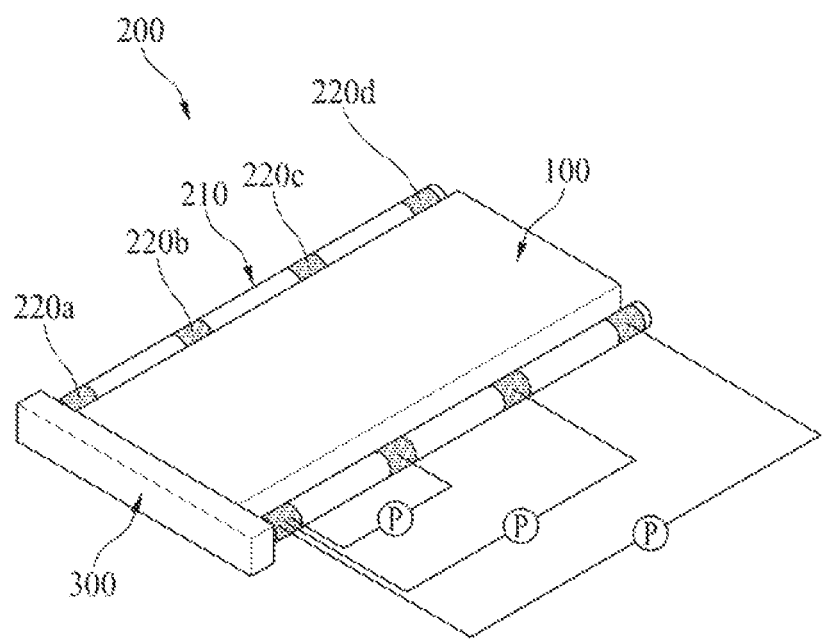
FIG. 13 is a schematic perspective view of a high speed actuator according to another embodiment of the present invention.

FIG. 13 is a schematic perspective view of a high speed actuator according to another embodiment of the present invention. Except for the structure of the active stiffness controller 200, the high speed actuator of FIG. 13 is the same as the high speed actuator of FIG. 12. Thus, like reference numerals refer to like elements. Hereinafter, only different elements will be described.

As seen in FIG. 13, the active stiffness controller 200 may include a smart material 210, a plurality of electrodes 220a, 220b, 220c and 220d, and a power source P.

The smart material 210 may include an SMA, but is not limited thereto. The smart material 210 may be on a surface of the actuation part 100 or inside the actuation part 100 as described above.

When an external current signal is applied to the smart material 210, the smart material 210 may contract, bend or shrink due to a phase change. When the current signal is applied to the smart material 210 even in a contracted, shrunk or bent state, the temperature of the smart material 210 may increase to cause the phase change, and thus, an electrical resistance may decrease, thereby increasing stiffness. Therefore, the electrical resistance of the smart material 210 may be controlled by using the current signal applied to the smart material 210, and thus, a stiffness of the smart material 210 may be changed, thereby controlling a stiffness of the active stiffness controller 200 in real time.

The plurality of electrodes 220a, 220b, 220c and 220d may be formed on the smart material 210. The plurality of electrodes 220a, 220b, 220c and 220d may be arranged at certain intervals on the smart material 210. The number and spacing or distance between the electrodes 220a, 220b, 220c and 220d may be fixed or may vary.

The power source P may be coupled to multiple ones (e.g., two) of the electrodes 220a, 220b, 220c and 220d to designate or define a current path. Therefore, a position at which the stiffness is changed in the smart material 210 may be determined or adjusted by changing a coupling structure between the power source P and the electrodes 220a, 220b, 220c and 220d. As illustrated, when a plurality of power sources P having different current paths are present, the position at which the stiffness is changed in the smart material 210 may be freely selected, changed or adjusted in real time.

Figure 14:
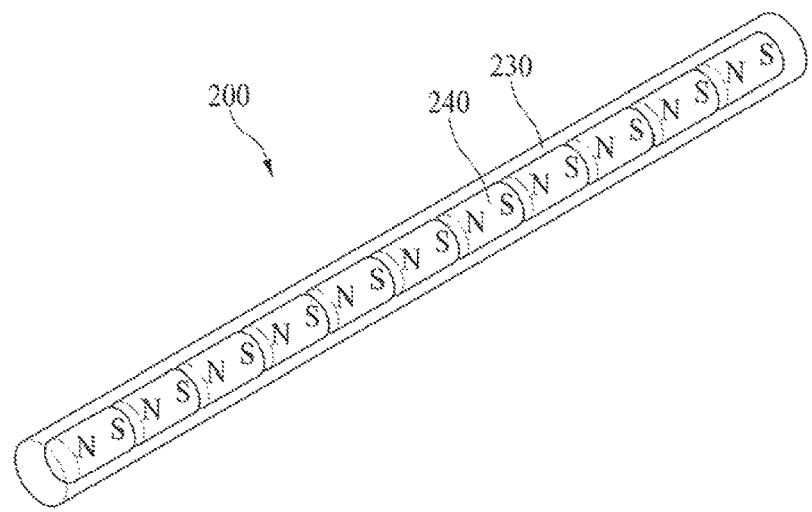
FIG. 14 is a schematic perspective view of an active stiffness controller that can be applied to a high speed actuator according to an embodiment of the present invention.

FIG. 14 is a schematic perspective view of an active stiffness controller 200 applied to a high speed actuator according to another embodiment of the present invention.

As seen in FIG. 14, the active stiffness controller 200 may include a base 230 and an electromagnet module 240.

The base 230 may comprise or be formed of a soft polymer material.

The electromagnet module 240 may be in the base 230. The electromagnet module 240 may comprise a plurality of electromagnet units. The units of the electromagnet module 240 may be in series in the base 230. The units of the electromagnet module 240 may be spaced or located at certain intervals, with no contact between adjacent units.

In the active stiffness controller 200 having the above-described structure, when an electrical signal is applied to the electromagnet module 240, an attraction may occur between the plurality of electromagnet module units, and in this case, a stiffness of the active stiffness controller 200 increases beyond the case where the electrical signal is not applied. Particularly, a stiffness of the active stiffness controller 200 may be freely adjusted in real time by controlling the amplitude of an external electrical signal.

Figure 15:
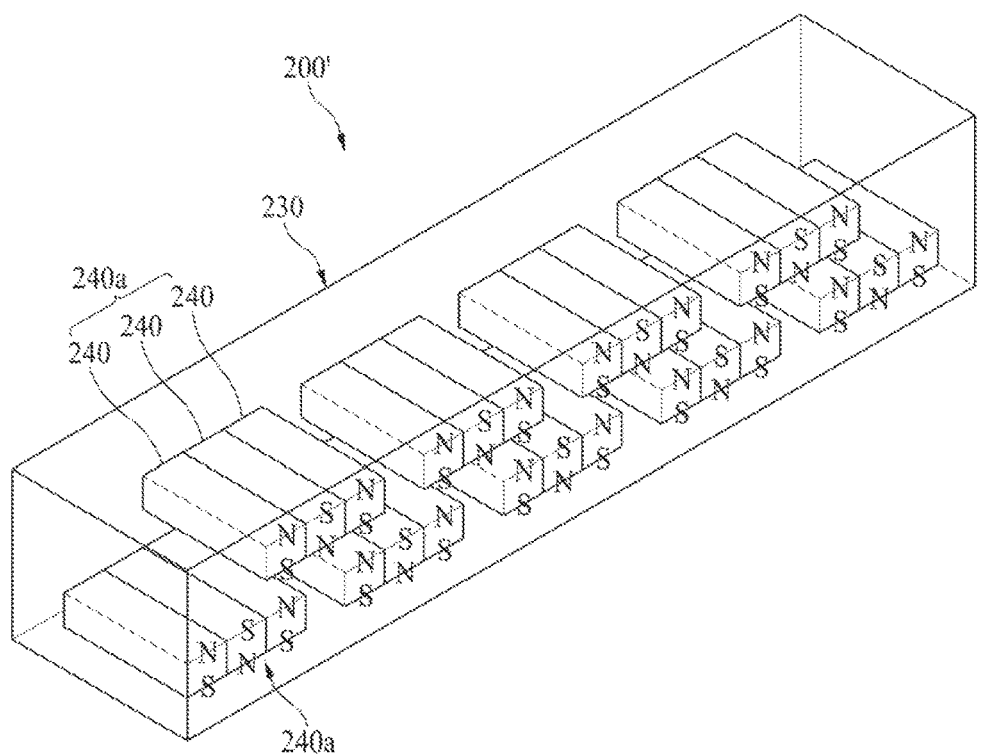
FIG. 15 is a schematic perspective view of another active stiffness controller that can be applied to a high speed actuator according to another embodiment of the present invention.

FIG. 15 is a schematic perspective view of an active stiffness controller 200' applied to a high speed actuator according to a further embodiment of the present invention.

As seen in FIG. 15, the active stiffness controller 200' may include a base 230 and an electromagnet module 240.

Similar to the high speed actuator illustrated in FIG. 14, the base 230 may comprise or be formed of a soft polymer material, and an electromagnet module 240 may be in the base 230.

In the high speed actuator 200' of FIG. 15, unlike the high speed actuator 200 of FIG. 14, a plurality of electromagnet modules 240 may be present, and the plurality of electromagnet modules 240 may be present or stacked in a plurality of layers. For example, as illustrated, the plurality of electromagnet modules 240 may be arranged or stacked in two layers. In each of the layers, the plurality of electromagnet modules 240 may be adjacent to each other and optionally in contact with one or two adjacent electromagnet modules 240 to configure an electromagnet module set 240a. A plurality of electromagnet module sets 240a may be present, and the plurality of electromagnet module sets 240a may be spaced or arranged at certain intervals (e.g., by a width of an electromagnet module 240).

A plurality of electromagnet modules may be in series in the electromagnet module set 240a, and moreover, a plurality of electromagnet module sets 240a in different layers may be in series (e.g., note the vertical arrangement of modules 240 in adjacent layers at an end of a horizontal series). In order for the plurality of electromagnet module sets 240a in different layers to be arranged in series, the electromagnet module sets 240a in a second layer may be in an area corresponding to a space between adjacent electromagnet module sets 240a in an adjacent layer.

When an electrical signal is applied to the plurality of electromagnet modules 240 having the above-described structure, an attraction may occur between the plurality of electromagnet modules 240, and thus, a stiffness of the active stiffness controller 200 may increase. Particularly, by adjusting a level of the applied electrical signal, the stiffness of the active stiffness controller 200' may be controlled in real time.

Due to the arrangement of the electromagnet module sets 240*a* in FIG. 15, any problems that may arise when the active stiffness controller 200 bends as a result of application of the electrical signal can be effectively solved, as the active stiffness controller 200' remains straight or substantially straight when the electrical signal is applied to the electromagnet module sets 240*a* in FIG. 15.

Figure 16:
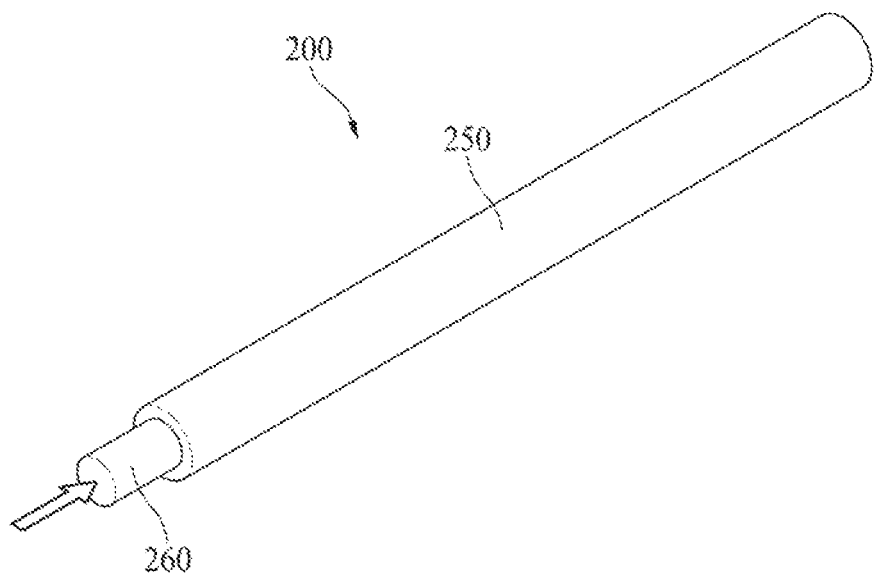
FIG. 16 is a schematic perspective view of yet another active stiffness controller that can be applied to a high speed actuator according to yet another embodiment of the present invention.

FIG. 16 is a schematic perspective view of an active stiffness controller 200 applied to a high speed actuator according to another embodiment of the present invention.

As seen in FIG. 16, the active stiffness controller 200 may include a soft tube or cylinder 250 and a fluid injection part 260 that communicates with the inside (e.g., contacts an inner surface) of the soft tube or cylinder 250.

The soft tube or cylinder 250 may comprise or be formed of a soft polymer material and may internally include an accommodation space for accommodating a fluid. In one embodiment, this space may be defined by a flexible liner, for example, that is impenetrable by the fluid.

The fluid injection part 260 may communicate with the inside of the soft tube or cylinder 250 to supply fluid, such as a gas or liquid, to the space inside the soft tube or cylinder 250.

When the fluid flows into the soft tube or cylinder 250 through the fluid injection part 260, the internal pressure of the soft tube or cylinder 250 may increase, and thus, a stiffness of the active stiffness controller 200 may be controlled by injecting the fluid into or withdrawing or releasing the fluid from the space in the soft tube or cylinder 250. Particularly, by adjusting the amount of fluid injected into or released from the soft tube or cylinder 250, the stiffness of the active stiffness controller 200 may be controlled in real time.

Figure 17:
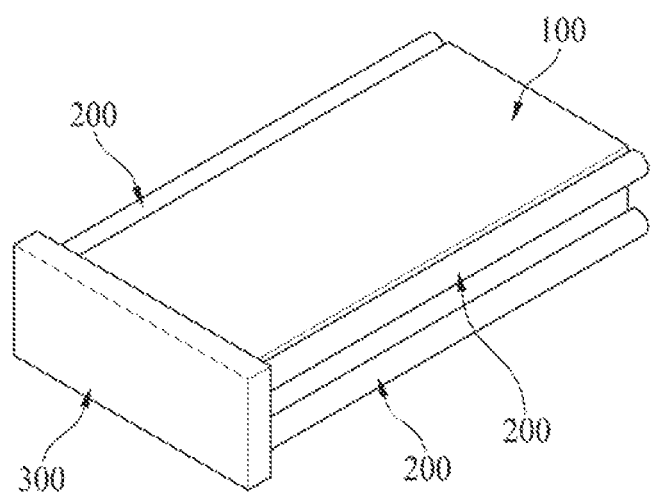
FIG. 17 is a schematic perspective view of a high speed actuator according to another embodiment of the present invention.

FIG. 17 is a schematic perspective view of a high speed actuator according to another embodiment of the present invention. Other than the number and positions of active stiffness controllers 200, the high speed actuator of FIG. 17 is the same as the high speed actuator of FIG. 12. Hereinafter, therefore, only different elements will be described.

As seen in FIG. 17, a plurality of active stiffness controllers 200 may be on opposite sides of the actuation part 100. In detail, the active stiffness controllers 200 may be on each of a left upper end, a left lower end, a right upper end, and a right lower end of the actuation part 100. Alternatively, the active stiffness controllers 200 may be on surfaces of the actuation part 100 that define the thickness, and optionally, the length of the actuation part 100, along or proximate to opposed edges of such surfaces. Each of the plurality of active stiffness controllers 200 may be individually actuated, and in this case, a stiffness of a specific position (e.g., an edge or surface of the actuation part 100) may increase by actuating only one or only some of the plurality of active stiffness controllers 200.

Hereinafter, a configuration of an actuation part 100 according to another embodiment of the present invention will be described.

Figure 18:
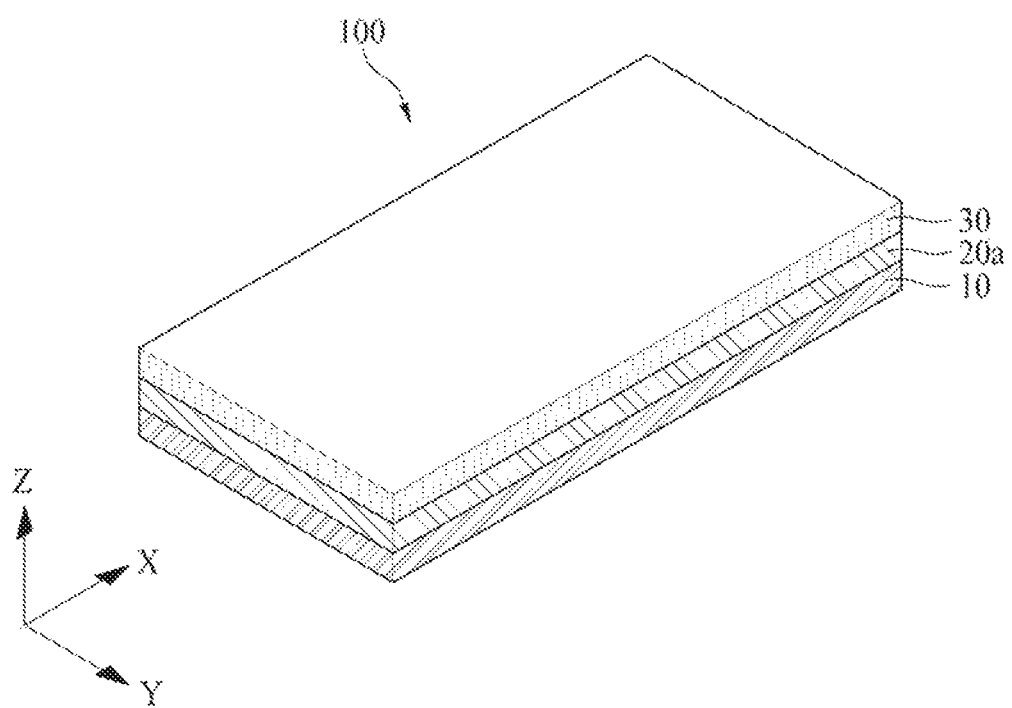
FIG. 18 is a schematic perspective view of an actuation part according to another embodiment of the present invention.

FIG. 18 is a schematic perspective view of an actuation part 100 according to another embodiment of the present invention.

As seen in FIG. 18, the actuation part 100 may include a first actuation part 10, a passive stiffness controller 20*a*, and a second actuation part 30.

The first actuation part 10 and the second actuation part 30 according to FIG. 18 are the same as the first actuation part 10 and the second actuation part 30 described above with reference to FIGS. 1 to 10, and thus, their detailed descriptions are not repeated.

The passive stiffness controller 20*a* may be between the first actuation part 10 and the second actuation part 30. The passive stiffness controller 20*a* may increase a stiffness of the actuator, thereby enabling the actuator to operate at a high speed. The passive stiffness controller 20*a* may include at least two stiffness control materials having different stiffnesses. That is, the passive stiffness controller 20*a* having a stiffness within desired or predetermined stiffness range may be obtained by appropriately selecting and combining a plurality of stiffness control materials having different stiffnesses. Examples of a stiffness control material available to the passive stiffness controller 20*a* may include a polymer resin. Depending on the kind or type of polymer, polymer resins have different stiffnesses, and by using and/or including different polymer resins, the passive stiffness controller 20*a* having any of various shapes may be implemented.

The passive stiffness controller 20*a* may be configured identically to the stiffness controller 20 described above with reference to FIG. 3A, 3B, 4, 5 or 6.

Moreover, the actuation part 100 illustrated in FIG. 18 may include one or more air holes H as shown in FIGS. 7A and 7B.

Moreover, the actuation part 100 illustrated in FIG. 18 may include a humidification layer 40 and a channel CH as shown in FIGS. 8A and 8B or FIG. 9.

Moreover, the high speed actuator according to FIG. 18 may include a passive part 60 as shown in FIG. 10.

Figure 19:
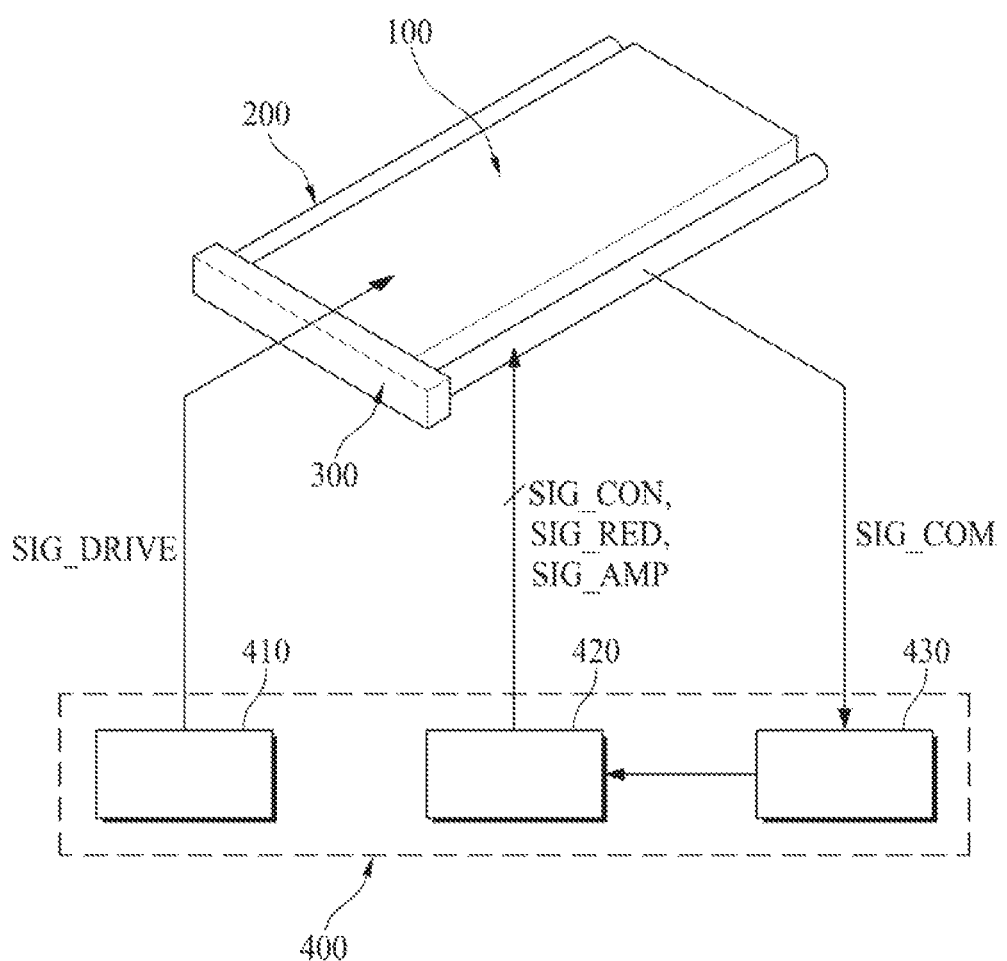
FIG. 19 is a schematic block diagram of a high speed actuator including a control unit according to another embodiment of the present invention.

FIG. 19 is a schematic block diagram of a high speed actuator including a control unit according to another embodiment of the present invention.

As seen in FIG. 19, the high speed actuator may include an actuation part 100, an active stiffness controller 200, a fixing part 300, and a control unit 400.

The details described above with reference to FIG. 12 may be applied to the actuation part 100, the active stiffness controller 200, and the fixing part 300, and thus, repetitive descriptions are not provided.

The control unit 400 may be included in the high speed actuator. In FIG. 19, for convenience of description, function blocks relevant to one or more operations of the control unit 400 are illustrated.

The control unit 400 may include an actuation control signal application unit 410, a stiffness control signal application unit 420, and a comparison unit 430.

The actuation control signal application unit 410 may apply an actuation control signal SIG_DRIVE to the actuation part 100. The actuation control signal SIG_DRIVE may be applied to the actuation part 100 and may control an operation, such as bending or twisting, of the actuation part 100. The actuation control signal SIG_DRIVE may be a current signal applied to a smart material in the actuation part 100 (e.g., in the first actuation part 10 and/or second actuation part 30).

The stiffness control signal application unit 420 may apply a stiffness control signal SIG_CON to the active stiffness controller 200. The stiffness control signal SIG_CON may change or maintain a stiffness (e.g., correspond to a predetermined stiffness) of the active stiffness controller 200. In one embodiment, the stiffness control signal SIG_CON may be a current signal applied to a smart material 210 (see FIG. 13). In other embodiments, the stiffness control signal SIG_CON may be a current signal applied to an electromagnet module 240 or electromagnet module set 240*a* (see FIGS. 14 and 15). In a further embodiment, the stiffness control signal SIG_CON may control a supply of fluid into and/or release of fluid from a soft tube or cylinder 250 (see FIG. 16).

The comparison unit 430 may compare a target stiffness A of the active stiffness controller 200 (e.g., before applying the stiffness control signal SIG_CON) with an actual stiffness B after applying the stiffness control signal SIG_CON. In one embodiment, by measuring a resistance of a smart material 210 (see, e.g., FIG. 13), correlating the measured resistance to an actual stiffness, and comparing the correlated actual stiffness with a target, the comparison unit 430 may compare the target stiffness A with an equivalent of the actual stiffness B. That is, a stiffness of the smart material 210 may be inversely proportional to the resistance of the smart material 210 (e.g., in a phase change period), and thus, by measuring the resistance of the smart material 210, the comparison unit 430 may indirectly measure the stiffness of the smart material 210. The comparison unit 430 may supply a result of comparing the target stiffness A with the actual stiffness B (or its equivalent) to the stiffness control signal application unit 420.

The stiffness control signal application unit 420 may apply a reduction signal SIG_RED or an amplifying signal SIG_AMP to the active stiffness controller 200, based on the result of comparing the target stiffness A with the actual stiffness B. When the actual stiffness B is greater than the target stiffness A, the stiffness control signal application unit 420 may apply the reduction signal SIG_RED to the active stiffness controller 200. When the actual stiffness B is less than the target stiffness A, the stiffness control signal application unit 420 may apply the amplifying signal SIG_AMP to the active stiffness controller 200. When the actual stiffness B is equal to the target stiffness A, the stiffness control signal application unit 420 may maintain a current state.

The reduction signal SIG_RED and the amplifying signal SIG_AMP may be separate signals. The reduction signal SIG_RED may be a signal generated by reducing or configured to reduce a current of the stiffness control signal SIG_CON, and the amplifying signal SIG_AMP may be a signal generated by amplifying or configured to increase the current of the stiffness control signal SIG_CON. That is, the embodiment of FIG. 13 may correspond to a case where a current signal lower or higher than a predetermined value is applied to the smart material 210, the embodiments of FIGS. 14 and 15 may correspond to cases where the current signal lower or higher than the predetermined value is applied to the electromagnet module 240 or the electromagnet module set 240a, and the embodiment of FIG. 16 may correspond to a case where less or more fluid is supplied to or released or removed from the soft tube or cylinder 250 (for example, at a different rate).

Figure 20:
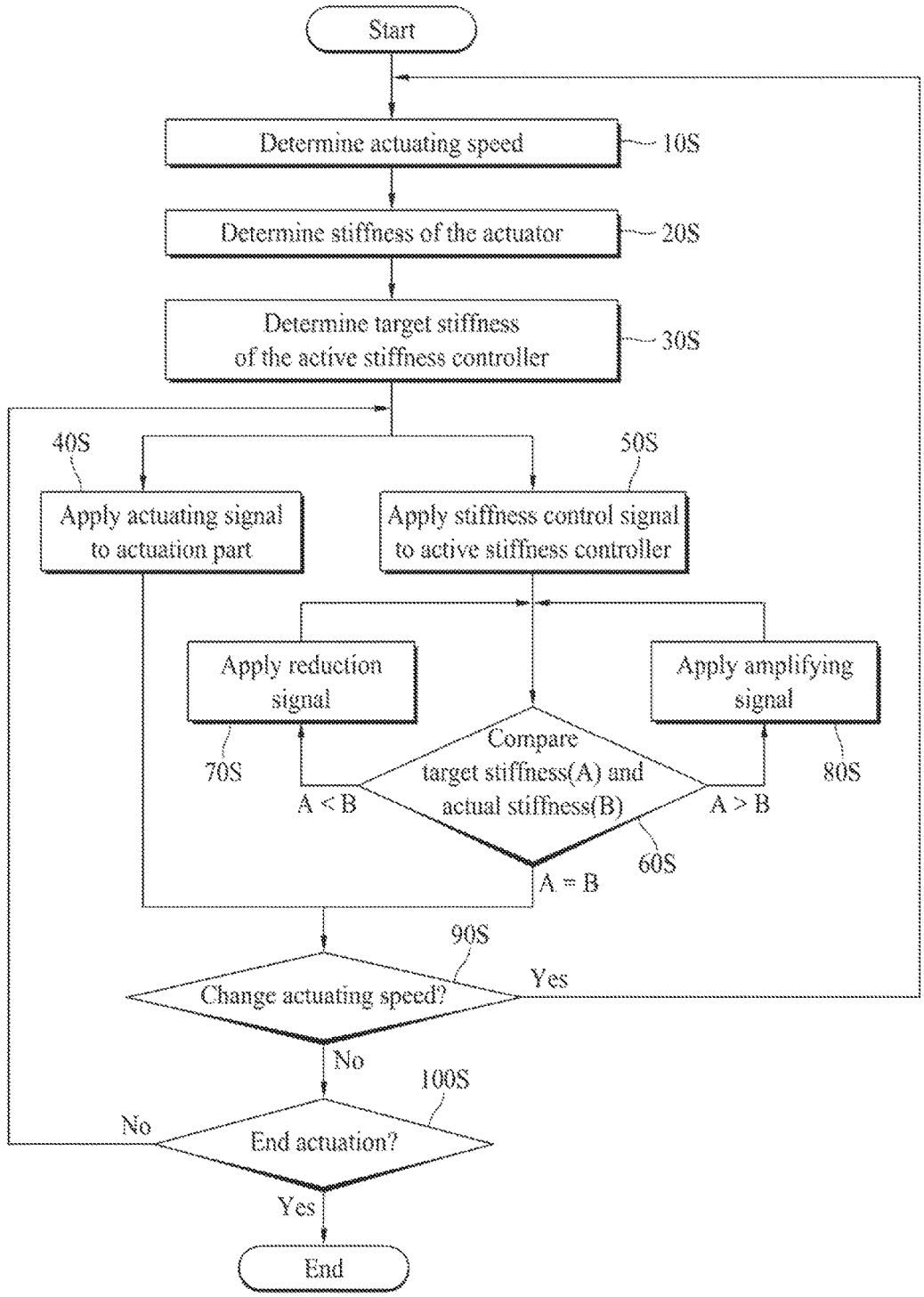
FIG. 20 is a flowchart illustrating a method of driving a high speed actuator according to another embodiment of the present invention.

FIG. 20 is a flowchart illustrating a method of driving a high speed actuator according to an embodiment of the present invention.

First, the method may determine an actuating speed of the actuator in operation 10S, and may determine a stiffness of the actuator based on the determined actuating speed in operation 20S.

The actuating speed may be determined based on the application field and usability of the actuator. When the actuating speed has been determined, the stiffness of the actuator may be determined so as to realize the actuating speed. As the actuating speed increases, the stiffness of the actuator increases, and the stiffness of the actuator may be determined based on pre-calculated data.

Subsequently, in operation 30S, the method may determine a target stiffness of an active stiffness controller.

As described above, the actuator may include an actuation part 100 and an active stiffness controller 200. The actuation part 100 may have certain stiffness according to a structure thereof, and if the structure is not changed, it may be difficult to control the stiffness. Therefore, the stiffness of the actuator which has been determined in operation 20S may be obtained by controlling a stiffness of the active stiffness controller 200. That is, in order to adjust the stiffness of the actuator which has been determined in operation 20S, a target stiffness of the active stiffness controller 200 may be determined in consideration of the stiffness based on the structure of the actuation part 100.

Subsequently, when the target stiffness of the active stiffness controller is determined, an external control unit (not shown) may apply an actuating signal to the actuation part 100 in operation 40S, and may apply a stiffness control signal to the active stiffness controller 200 in operation 50S.

The actuating signal may be applied to the actuation part 100 and the stiffness control signal may be applied to the active stiffness controller 200 simultaneously, but are not limited thereto.

When the actuating signal is applied to the actuation part 100, the actuator may be actuated (e.g., may bend and/or twist). When the stiffness control signal is applied to the active stiffness controller 200, the stiffness of the actuator may change, and the actuator may be actuated at a predetermined speed.

Applying the actuating signal to the actuation part 100 may include applying a current signal to a smart material of the actuator 100.

In one embodiment, applying the stiffness control signal to the active stiffness controller 200 may include applying a current signal to the smart material 210 (see, e.g., FIG. 13). In other embodiments, applying the stiffness control signal to the active stiffness controller 200 may include applying the current signal to the electromagnet module 240 (see, e.g., FIGS. 14 and 15). In a further embodiment, applying the stiffness control signal to the active stiffness controller 200 may include supplying fluid to the soft tube or cylinder 250 (see, e.g., FIG. 16).

Subsequently, in operation 60S, the method may compare a target stiffness A of the active stiffness controller 200 (e.g., before applying a stiffness control signal) with an actual stiffness B of the active stiffness controller (e.g., after applying the stiffness control signal). Thus, the method may further comprise determining the actual stiffness of the active stiffness controller prior to comparing the target stiffness of the active stiffness controller with the actual stiffness of the active stiffness controller.

When the actual stiffness B is greater than the target stiffness A (e.g., as a result of the comparison), a reduction signal may be applied to the active stiffness controller 200 in operation 70S. When the actual stiffness B is less than the target stiffness A (e.g., as the comparison result), an amplifying signal may be applied to the active stiffness controller 200 in operation 80S. When the actual stiffness B is equal to the target stiffness A (e.g., as the comparison result), a current state may be maintained.

In one embodiment, by measuring a resistance of the smart material 210 (see, e.g., FIG. 13), the method may compare the target stiffness A with an equivalent of the actual stiffness B in operation 60S. That is, since a stiffness of the smart material 210 is inversely proportional to the resistance (e.g., in a phase change period), by measuring the resistance of the smart material 210, the method may indirectly measure the stiffness of the smart material 210.

The reduction signal or the amplifying signal may indicate that the signal applied in operation 50S is reduced or amplified. That is, the embodiment of FIG. 13 may correspond to a case where a current signal lower or higher than a predetermined value is applied to the smart material 210, the embodiment of FIGS. 14 and 15 may correspond to a case where the current signal lower or higher than the predetermined value is applied to the electromagnet module 240, and the embodiment of FIG. 16 may correspond to a case where less or more fluid than a predetermined value is supplied to or released or removed from the soft tube or cylinder 250 (for example, at a different rate).

Subsequently, in operation 905, whether to change the actuating speed of the actuator may be determined.

When the actuating speed is changed, the method may be again performed from operation 10S of determining the actuating speed. When the actuating speed is not changed, a current state may be maintained.

Subsequently, in operation 1005, whether to end an actuation of the actuator may be determined.

When ending the actuation of the actuator has been determined, the actuation may end. When ending the actuation of the actuator is not determined, operations subsequent to operation 30S of determining the target stiffness of the active stiffness controller may be repeated.

As described above, according to one embodiment of the present invention, a stiffness of the stiffness controller may vary according to an actuating speed, thereby implementing the high speed actuator.

Moreover, according to another embodiment of the present invention, the active stiffness controller may control a stiffness of the high speed actuator in order for the actuator to be actuated at a high speed, and moreover, since the stiffness of the actuator is controlled in real time, a speed of the actuator may be controlled in real time.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A high speed actuator comprising:
an actuation part configured to cause deformation that includes bending or twisting; and
an active stiffness controller on a surface of the actuation part or in the actuation part configured to control in real time a stiffness according to an external signal, wherein:
the actuation part comprises:
a first actuation part including a plurality of first smart materials or smart material units and a first base material supporting the plurality of first smart materials or smart material units, the first actuation part being deformable in a first direction; and
a second actuation part including a plurality of second smart materials or smart material units and a second base material supporting the plurality of second smart materials or smart material units, the second actuation part being deformable in a second direction,
the plurality of first smart materials are arranged or oriented in a first common direction,
the plurality of second smart materials are arranged or oriented in a second common direction, and
the first direction in which the first actuation part is deformable differs from the second direction in which the second actuation part is deformable.

2. The high speed actuator of claim 1, wherein the active stiffness controller comprises:
a smart material;
a plurality of electrodes on the smart material; and
a plurality of power sources, each of said power sources being connected to at least two of the plurality of electrodes, and each combination of one of the power sources and at least two of the plurality of electrodes forming a current path.

3. The high speed actuator of claim 1, wherein:
the active stiffness controller comprises a base and a plurality of electromagnet module sets in the base and spaced apart from each other,
the plurality of electromagnet module sets each comprise a plurality of electromagnet modules adjacent to each other, and
the plurality of electromagnet module sets comprise a plurality of first electromagnet module sets in a first layer and a plurality of second electromagnet module sets in a second layer, at least one of the plurality of second electromagnet module sets being in an area corresponding to a space between adjacent first electromagnet module sets.

4. The high speed actuator of claim 1, wherein the active stiffness controller comprises:
a soft tube or cylinder; and
a fluid injection part communicating with the soft tube or cylinder to supply and/or remove fluid into the soft tube or cylinder.

5. The high speed actuator of claim 1, further comprising:
a passive stiffness controller between the first actuation part and the second actuation part, the passive stiffness controller including:
a first passive stiffness controller including a first polymer resin having a first stiffness; and
a second passive stiffness controller including a second polymer resin having a second stiffness, the first passive stiffness controller contacting the second passive stiffness controller.

6. The high speed actuator of claim 1, wherein the first actuation part or the second actuation part comprises one or more air holes.

7. The high speed actuator of claim 1, wherein the actuation part further comprises:
a channel configured to allow a fluid to flow therethrough; and
a humidification layer in contact with or over the channel.

8. The high speed actuator of claim 1, further comprising a control unit, the control unit including:
an actuation control signal application unit configured to apply an actuation control signal to the actuation part;
a stiffness control signal application unit configured to apply a stiffness control signal to the active stiffness controller; and
a comparison unit configured to compare an actual stiffness with a target stiffness of the active stiffness controller.

9. The high speed actuator of claim 8, wherein the stiffness control signal application unit is configured to apply a reduction signal or an amplifying signal to the active stiffness controller, based on a result of a comparison by the comparison unit.

10. A high speed actuator comprising:
a first actuation part including a plurality of first smart materials or smart material units and a first base material supporting the plurality of first smart materials or smart material units, the first actuation part being deformable in a first direction;
a second actuation part including a plurality of second smart materials or smart material units and a second base material supporting the plurality of second smart materials or smart material units, the second actuation part being deformable in a second direction; and
a stiffness controller between the first actuation part and the second actuation part,
wherein:
the plurality of first smart materials or smart material units are arranged or oriented in a first common direction, the plurality of second smart materials or smart material units are arranged or oriented in a second common direction, and the first direction in which the first actuation part is deformable differs from the second direction in which the second actuation part is deformable, and
the stiffness controller includes a first stiffness controller including a first polymer resin having a first stiffness and a second stiffness controller including a second polymer resin having a second stiffness, the first stiffness controller contacting the second stiffness controller.

11. The high speed actuator of claim 10, wherein:
the first stiffness controller has a plurality of island structures, and
the second stiffness controller is between adjacent island structures.

12. The high speed actuator of claim 10, wherein the first stiffness controller and the second stiffness controller alternate and are arranged or oriented in a same direction.

13. The high speed actuator of claim 10, wherein at least one of the first actuation part, the second actuation part, and the stiffness controller comprises an air hole.

14. The high speed actuator of claim 10, wherein the actuation part further comprises:
a channel configured to allow a fluid to flow therethrough; and
a humidification layer in contact with or over the channel.

15. A method of driving a high speed actuator, the high speed actuator including an actuation part configured to cause deformation that includes bending or twisting and an active stiffness controller on a surface of the actuation part or in the actuation part configured to control in real time a stiffness according to an external signal, the method comprising:
determining an actuating speed of the actuator and determining a stiffness of the actuator based on the determined actuating speed;
determining a target stiffness of the active stiffness controller;
applying an actuating signal to the actuation part and applying a stiffness control signal to the active stiffness controller; and
comparing a target stiffness of the active stiffness controller with an actual stiffness of the active stiffness controller after applying the stiffness control signal;
applying a reduction signal to the active stiffness controller when the actual stiffness is greater than the target stiffness, and applying an amplifying signal to the active stiffness controller when the actual stiffness is less than the target stiffness.

16. The method of claim 15, wherein applying the stiffness control signal to the active stiffness controller comprises at least one of:
applying a current signal to a smart material in the active stiffness controller;
applying the current signal to an electromagnet module in the active stiffness controller; and
supplying a fluid to or releasing the fluid from a soft tube or cylinder in the active stiffness controller.

17. The method of claim 15, wherein:
applying the stiffness control signal to the active stiffness controller comprises applying a current signal to a smart material in the active stiffness controller, and
comparing the target stiffness with the actual stiffness comprises measuring a resistance of the smart material in the active stiffness controller.

18. The method of claim 15, further comprising:
after the comparing of the target stiffness with the actual stiffness,
determining whether to change an actuating speed of the actuator; and
determining whether to end actuation of the actuator.

19. The method of claim 15, wherein determining the stiffness of the actuator comprises:
determining a natural frequency of the actuator based on the determined actuating speed;
determining an actuating displacement;
determining a length of the actuator based on the determined actuating displacement; and
determining the stiffness of the actuator based on the determined natural frequency and the determined length of the actuator.

* * * * *